United States Patent
Alrod et al.

(10) Patent No.: US 8,433,980 B2
(45) Date of Patent: Apr. 30, 2013

(54) FAST, LOW-POWER READING OF DATA IN A FLASH MEMORY

(75) Inventors: Idan Alrod, Herzliya (IL); Menahem Lasser, Kochav Yair (IL)

(73) Assignee: Sandisk IL Ltd., Kfar Saba (IL)

( * ) Notice: Subject to any disclaimer, the term of this patent is extended or adjusted under 35 U.S.C. 154(b) by 1025 days.

(21) Appl. No.: 12/434,652

(22) Filed: May 3, 2009

(65) Prior Publication Data

US 2009/0319872 A1    Dec. 24, 2009

Related U.S. Application Data

(60) Provisional application No. 61/074,684, filed on Jun. 23, 2008.

(51) Int. Cl.
*G11C 29/00*    (2006.01)
(52) U.S. Cl.
USPC .......................... 714/773; 714/758; 714/800
(58) Field of Classification Search .................. 714/773, 714/758, 720, 800, 752, 22, 32; 365/148; 257/319
See application file for complete search history.

(56) References Cited

U.S. PATENT DOCUMENTS

| | | | |
|---|---|---|---|
| 5,274,599 A * | 12/1993 | Ema | 365/185.22 |
| 5,768,215 A | 6/1998 | Kwon et al. | 365/238.5 |
| 7,095,644 B2 * | 8/2006 | Chevallier et al. | 365/148 |
| 7,099,179 B2 * | 8/2006 | Rinerson et al. | 365/148 |
| 2004/0060031 A1 | 3/2004 | Cernea | 716/16 |
| 2005/0135148 A1 * | 6/2005 | Chevallier et al. | 365/171 |
| 2006/0114730 A1 | 6/2006 | Lee et al. | 365/189.05 |
| 2008/0013374 A1 | 1/2008 | Li et al. | |
| 2008/0157169 A1 * | 7/2008 | Yuan | 257/319 |

* cited by examiner

*Primary Examiner* — Fritz Alphonse

(57) ABSTRACT

A memory includes cells at intersections of word lines and bit lines, word and bit line selection mechanisms and a programming mechanism. The cells on each bit line are connected in series. Cells of a word line are programmed simultaneously. For low-power reading, only some of the bit lines that intersect the word line at the programmed cells are selected and only the cells at those intersections are sensed. Another type of memory includes a physical page of cells, a sensing mechanism and a selection mechanism. Hard bits are sensed from all the cells of the physical page. Only some of those cells are selected for sensing soft bits. Another memory includes a plurality of cells, a sensing mechanism, an export mechanism and a selection mechanism. Hard and soft bits are sensed from all the cells of the plurality. Only some of the soft bits are selected for export.

19 Claims, 4 Drawing Sheets

FAST, LOW-POWER READING OF DATA IN A FLASH MEMORY

This patent application claims the benefit of U. S. Provisional Patent Application No. 61/074,684, filed Jun. 23, 2008

FIELD AND BACKGROUND OF THE INVENTION

The present invention relates to flash memories and, more particularly, to fast, low-power reading of data stored in a flash memory, with particular application to soft bits used in error correction.

Some flash memory storage systems use "soft bits" when attempting to correct errors in data read from the memory. The term "soft bits" refers to high-resolution reading from the memory cells, which goes beyond the true resolution of the data stored into the memory cells. For example, in a two-bits-per-cell memory the threshold voltage window of the cells is divided into four non-overlapping regions, each corresponding to one of the four possible data values stored in a cell—{"00", "01", "10", "11"}. Each region corresponds to one state of the cell.

Normal reading (without soft bits) identifies each read cell as being in one of the four states, thus associating one of the four data values with the cell. Reading soft bits from the memory (in this example) means that we identify each cell as being in one of more than four states—for example in one of eight states, where each of the four original states is split into two higher-resolution states.

The simplest and most common way to do that (but not the only one) is by placing a reference reading voltage in the middle of each of the four non-overlapping threshold voltage regions, thus identifying whether the cell is in the upper or lower half of the region.

Some storage systems use more than one soft bit—for example using two soft bits that divide each original state into four new states. Also, the use of soft bits is not limited to two-bits-per-cell flash memories—one can use a four-bits-per-cell memory (having originally sixteen states) and apply one or more soft bits on top of the sixteen states, thus generating 32 or more new states.

The advantage of using soft bits when reading data from a flash memory comes into effect when having to correct errors in the data, and especially when the number of errors is relatively high.

The soft bits provide useful information to the decoder attempting to reconstruct the originally-written data, as the soft bits allow better estimation of the reliability of each bit stored in the flash device based on the probabilities for different errors to appear in the data.

This use of soft bits is especially useful and convenient to use with soft decoders (not to be confused with soft bits). Soft decoders are decoders that correct errors in data by attaching a reliability measure to each data bit. Having attached a reliability measure to each data bit, there are several options for operating the soft decoder. Among the popular strategies are:
  Operating on the reliability values, refining and improving them, usually iteratively, until a success test (or a failure test) terminates the decoding process.
  Computing a metric that determines which most probable programmed code word fits the read data.
  Computing a metric for each bit of the read word separately, according to the entire read data, then using the metrics to independently decide upon the value of each bit.

Soft bits are naturally matched with soft decoders as soft decoders can exploit the initial reliability measures, thus in some cases providing the difference between success and failure of the entire decoding process. In some cases the use of soft bits also speeds up the convergence of the decoding computation.

However, soft bits may also be used with hard decoders (decoders that are not soft decoders), and the technology described herein applies equally to both types of error correcting decoders.

While being very useful in correcting errors in stored data, soft bits come with a high price. Reading a soft bit requires doing additional reading operations from the memory cells, and thus slowing down the reading operation. This is easily understood—additional comparisons to read reference voltages must be done in the memory cells, and then the detected values must be transferred from the memory die to the flash controller containing the ECC decoder. Sometimes the operation of soft bit read takes longer and cost more in power than reading only the "hard bits", this depends on the number of soft bits read.

There are also uses of these soft bits (higher resolution bits) other than decoding. For example statistical parameters with respect to the data can be employed for improving the read threshold parameters employed.

While in other scenarios (for example ECC in a communication channel) all soft bits are usually read anyway, it is typically the case in decoders, that use soft bits for reading data from a memory, that initially only the "hard" bits are read. Then if it turns out the raw data is too noisy and the decoding does not succeed—soft bits are read and added to the decoding computations. It is even possible to have multiple stages of this "trial and error" method—first reading one soft bit, and then if the decoding still fails—reading a second soft bit and so on. This way no time is spent on reading soft bits unless successful decoding cannot be achieved without soft bits. But the basic problem still remains—if reading soft bits proves necessary, a high price in time is paid.

In addition, unnecessary power is spent on sensing soft bits that are not really needed, reading their values from the array of cells to the flash data register. Additional unnecessary power is spent when transferring soft bits that are not really needed from the data register to the flash controller.

SUMMARY OF THE INVENTION

One embodiment provided herein is, in a memory that includes an array of cells at intersections of a plurality of word lines and a plurality of ordered bit lines, with the cells that share a common bit line being connected in series, a method of reading the cells that share a word line, including: (a) programming, substantially simultaneously, at least a portion of the cells of the wordline; (b) selecting only a portion of the bit lines that intersect the word line at the at least portion of cells that was programmed substantially simultaneously; and (c) sensing only the cells of the word line that are at the intersections of the word line with the portion of the bit lines.

Another embodiment provided herein is a memory, including: (a) a plurality of cells at intersections of a plurality of word lines and a plurality of bit lines, with the cells that share a common bit line being connected in series; (b) a word line selection mechanism for selecting one of the word lines; (c) a programming mechanism for programming, substantially simultaneously, at least a portion of the cells of the selected word line; and (d) a bit line selection mechanism for selecting only a portion of the bit lines that intersect the selected word line at the at least portion of the cells that was programmed substantially simultaneously, and for sensing only the cells, of the at least portion of the cells of the selected word line, that are at intersections of the selected word line with the selected portion of the bit lines.

Another embodiment provided herein is a memory device including: (a) a memory including: (i) a plurality of cells at intersections of a plurality of word lines and a plurality of bit lines, with the cells that share a common bit line being connected in series, (ii) a word line selection mechanism for selecting one of the word lines, (iii) a programming mechanism for programming, substantially simultaneously, at least a portion of the cells of the selected word line, and (iv) a bit line selection mechanism for selecting only a portion of the bit lines that intersect the selected word line at the at least portion of the cells that was programmed substantially simultaneously, and for sensing only the cells, of the at least portion of the cells of the selected word line, that are at intersections of the selected word line with the selected portion of the bit lines; and (b) a controller, of the memory, for instructing the bit line selection mechanism to select the portion of the bit lines.

Another embodiment provided herein is a system including: (a) a first memory including: (i) a plurality of cells at intersections of a plurality of word lines and a plurality of bit lines, with the cells that share a common bit line being connected in series, (ii) a word line selection mechanism for selecting one of the word lines, (iii) a programming mechanism for programming, substantially simultaneously, at least a portion of the cells of the selected word line, and (iv) a bit line selection mechanism for selecting only a portion of the bit lines that intersect the selected word line at the at least portion of the cells that was programmed substantially simultaneously, and for sensing only the cells, of the at least portion of the cells of the selected word line, that are at intersections of the selected word line with the selected portion of the bit lines; (b) a host of the first memory, the host including: (i) a second memory for storing code for instructing the bit line selection mechanism to select the portion of the bit lines, and (ii) a processor for executing the code.

Another embodiment provided herein is a computer-readable storage medium having embodied thereon computer-readable code for managing a memory that includes: (a) a plurality of cells at intersections of a plurality of word lines and a plurality of bit lines, with the cells that share a common bit line being connected in series, (b) a word line selection mechanism for selecting one of the word lines, (c) a programming mechanism for programming, substantially simultaneously, at least a portion of the cells of the selected word line, and (d) a bit line selection mechanism for selecting only a portion of the bit lines that intersect the selected word line at the at least portion of the cells that was programmed substantially simultaneously, and for sensing only the cells, of the at least portion of the cells of the selected word line, that are at intersections of the selected word line with the selected portion of the bit lines, the computer-readable code including program code for instructing the bit line selection mechanism to select the portion of the bit lines.

Another embodiment provided herein is a method of reading a physical page of cells of a memory, including: (a) sensing hard bits from all the cells of the physical page; (b) selecting only a portion of the cells of the physical page for sensing soft bits; and (c) sensing soft bits from only the selected portion of the cells of the physical page.

Another embodiment provided herein is a controller, for a memory that includes: (a) a physical page of cells, (b) a sensing mechanism for sensing the cells, and (c) a selection mechanism for selecting cells of the physical page for sensing, the controller being operative: (i) to use the sensing mechanism to sense hard bits from all the cells of the physical page; (ii) to use the selection mechanism to select only a portion of the cells of the physical page for sensing soft bits; and (iii) to use the sensing mechanism to sense soft bits from only the selected portion of the cells of the physical page.

Another embodiment provided herein is a memory device including: (a) a memory including: (i) a physical page of cells, (ii) a sensing mechanism for sensing the cells, and (iii) a selection mechanism for selecting cells of the physical page for sensing; and (b) a controller for: (i) using the sensing mechanism to sense hard bits from all the cells of the physical page, (ii) using the selection mechanism to select only a portion of the cells of the physical page for sensing soft bits, and (iii) using the sensing mechanism to sense soft bits from only the selected portion of the cells of the physical page.

Another embodiment provided herein is a system including: (a) a first memory including: (i) a physical page of cells, (ii) a sensing mechanism for sensing the cells, and (iii) a selection mechanism for selecting cells of the physical page for sensing; and (b) a host of the first memory, the host including: (i) a second memory for storing code for: (A) using the sensing mechanism to sense hard bits from all the cells of the physical page, (B) using the selection mechanism to select only a portion of the cells of the physical page for sensing soft bits, and (C) using the sensing mechanism to sense soft bits from only the selected portion of the cells of the physical page, and (ii) a processor for executing the code.

Another embodiment provided herein is a computer-readable storage medium having embodied thereon computer-readable code for managing a memory that includes: (a) a physical page of cells, (b) a sensing mechanism for sensing the cells, and (c) a selection mechanism for selecting cells of the physical page for sensing, the computer-readable code including: (a) program code for using the sensing mechanism to sense hard bits from all the cells of the physical page; (b) program code for using the selection mechanism to select only a portion of the cells of the physical page for sensing soft bits; and (c) program code for using the sensing mechanism to sense soft bits from only the selected portion of the cells of the physical page.

Another embodiment provided herein is a method of reading a plurality of cells of a memory, including: (a) sensing hard bits from all the cells of the plurality; (b) sensing soft bits from all the cells of the plurality; and (c) selecting only a portion of the soft bits to export from the memory.

Another embodiment provided herein is a controller, for a memory that includes: (a) a plurality of cells, (b) a sensing mechanism for sensing hard and soft bits from the cells of the plurality, (c) an export mechanism for exporting the sensed bits, and (d) a selection mechanism for selecting which bits to export, the controller being operative: (i) to use the sensing mechanism to sense the hard and soft bits; (ii) to use the export mechanism to receive all the hard bits from the memory; (iii) to use the selection mechanism to select only a portion of the soft bits to receive from the memory; and (iv) to use the export mechanism to receive the selected portion of the soft bits.

Another embodiment provided herein is a memory device including: (a) a memory including: (i) a plurality of cells, (ii) a sensing mechanism for sensing hard and soft bits from the cells of the plurality, (iii) an export mechanism for exporting the sensed bits, and (iv) a selection mechanism for selecting which bits to export; and (b) a controller for: (i) using the sensing mechanism to sense the hard and soft bits, (ii) using the export mechanism to receive all the hard bits from the memory, (iii) using the selection mechanism to select only a portion of the soft bits to receive from the memory, and (iv) using the export mechanism to receive the selected portion of the soft bits.

Another embodiment provided herein is a system including: (a) a first memory including: (i) a plurality of cells, (ii) a sensing mechanism for sensing hard and soft bits from the cells of the plurality, (iii) an export mechanism for exporting the sensed bits, and (iv) a selection mechanism for selecting which bits to export; and (b) a host of the first memory, the host including: (i) a second memory for storing code for: (A) using the sensing mechanism to sense the hard and soft bits, (B) using the export mechanism to receive all the hard bits from the memory, (C) using the selection mechanism to select only a portion of the soft bits to receive from the memory, and (D) using the export mechanism to receive the selected portion of the soft bits, and (ii) a processor for executing the code.

Another embodiment provided herein is a computer-readable storage medium having embodied thereon computer-readable code for managing a memory that includes: (a) a plurality of cells, (b) a sensing mechanism for sensing hard and soft bits from the cells of the plurality, (c) an export mechanism for exporting the sensed bits, and (d) a selection mechanism for selecting which bits to export, the computer-readable code including: (a) program code for using the sensing mechanism to sense the hard and soft bits, (b) program code for using the export mechanism to receive all the hard bits from the memory, (c) program code for using the selection mechanism to select only a portion of the soft bits to receive from the memory, and (d) program code for using the export mechanism to receive the selected portion of the soft bits.

Presented herein are two general methods for saving power in reading a memory such as a flash memory and a general method for saving time in reading a memory such as a flash memory.

The first general method for saving power is intended for use in a memory that includes an array of cells at intersections of a plurality of word lines and a plurality of ordered bit lines, with cells that share a common bit line being connected in series. Some or all of the cells of a word line (i.e., the cells that share a word line) are programmed substantially simultaneously. That the cells are programmed "substantially simultaneously" means that the cells are operated on together physically to place the cells into respective physical states that represent the data to be stored in the cells. In the case of flash cells, the typical physical operation for programming the cells is injecting electrons into the cells' floating gates. Only a portion of the bit lines that intersect the word line at the cells that were programmed simultaneously is selected for reading. Only those cells are sensed.

In some embodiments of the method, the selecting of the bit lines to be sensed is effected by steps including specifying a starting bit line of the selected portion of bit lines. The selected portion of bit lines then includes the starting bit line and all higher (i.e., subsequent in the bit line ordering) bit lines that intersect the word line at the substantially simultaneously programmed cells.

In other embodiments of the method, the selecting of the bit lines to be sensed is effected by steps including specifying an ending bit line of the selected portion of bit lines. The selected portion of bit lines then includes the ending bit line and all lower (i.e., preceding in the bit line ordering) bit lines that intersect the word line at the substantially simultaneously programmed cells.

In yet other embodiments of the method, the selecting of the bit lines to be sensed is effected by steps including specifying a starting bit line and an ending bit line of the selected portion of bit lines. If the "starting" bit line precedes the "ending" bit line in the bit line ordering then the selected portion of bit lines includes all the bit lines from the starting bit line through the ending bit line that intersect the word line at the substantially simultaneously programmed cells. If the "starting" bit line follows the "ending" bit line in the bit line ordering then the selected portion of bit lines includes all the bit lines from the first bit line through the ending bit line that intersect the word line at the substantially simultaneously programmed cells and all the bit lines from the starting bit line through the last bit line that intersect the word line at the substantially simultaneously programmed cells.

In some embodiments of the method, the bit lines are grouped into a plurality of disjoint sets. In principle, each set could include only one bit line, but normally each set includes several bit lines. The selecting is effected by specifying one or more of the disjoint sets. The selected portion of the bit lines then includes the bit line(s) of the specified set(s) that intersect the word line at the substantially simultaneously programmed cells.

A memory corresponding to the first general method of saving power includes a plurality of cells at the intersections of a plurality of word lines and a plurality of bit lines, with the cells that share a common bit line being connected in series. The memory also includes a word line selection mechanism for selecting one of the word lines, a programming mechanism for programming, substantially simultaneously, at least a portion of the cells of the selected word line, and a bit line selection mechanism for selecting only a portion of the bit lines that intersect the selected word line where the word line was programmed substantially simultaneously and for sensing only the simultaneously programmed cells at the intersections of the word line and the selected portion of the bit lines.

In some embodiments of the memory, the bit line selection mechanism selects the bit lines individually, rather than in groups.

In some embodiments of the memory, the bit line selection mechanism includes a register that includes a plurality of bits for indicating the selected portion of the bit lines.

A memory device corresponding to the first general method of saving power includes a memory that corresponds to the first general method of saving power, and a memory controller for instructing the bit line selection mechanism to select the portion of the bit lines. In some embodiments of the memory device, to instruct the bit line selection mechanism to select the portion of the bit lines, the controller issues a command that includes a single bit line selection parameter value that specifies either a starting bit line of the portion of bit lines or an ending bit line of the portion of bit lines. In other embodiments of the memory device, to instruct the bit line selection mechanism to select the portion of the bit lines, the controller issues a command that includes two bit line selection parameter values that specify a range of bit lines. For example, the command may be defined so that the first bit selection parameter is an index of a starting bit line and the second bit selection parameter value is an index of an ending bit line. If the value of the first bit selection parameter is less than the value of the second bit selection parameter then the selected portion of the bit lines is all bit lines from the starting bit line through the ending bit line that intersect the word line at the substantially simultaneously programmed cells. If the value of the first bit selection parameter is greater than the value of the second bit selection parameter then the selected portion of the bit lines is all bit lines from the first bit line through the ending bit line that intersect the word line at the substantially simultaneously programmed cells and all bit lines from the starting bit line through the last bit line that intersect the word line at the substantially simultaneously programmed cells.

In some embodiments of the memory device, the bit lines are grouped into a plurality of disjoint sets. The bit line selection mechanism includes a register for flagging at least one of the disjoint sets as selected for sensing. Preferably, to instruct the bit line selection mechanism to select the portion of the bit lines, the controller issues a bit line selection command that specifies at least one set of the plurality of disjoint sets to be flagged in the register.

In some embodiments of the memory device, to instruct the bit line selection mechanism to select the portion of the bit lines, the controller issues a command that specifies the portion of the bit lines for a single command issued by the controller for sensing the substantially simultaneously programmed cells where the selected bit lines intersect the selected word line. The specifying command is either a bit line selection command that is valid for only one subsequent read command or a combined read and bit line selection command whose bit line selection is valid only for itself. In both cases, if a subsequent read command does not also select bit lines and is not preceded by a command that selects bit lines, then that subsequent read command senses all the simultaneously programmed cells of the word line.

In other embodiments of the memory device, to instruct the bit line selection mechanism to select the portion of the bit lines, the controller issues a command that specifies the portion of the bit lines for every command, if any, that is issued subsequently by the controller for sensing the substantially simultaneously programmed cells where the selected bit lines intersect the selected word line, until the controller issues another command that specifies the portion of the bit lines. (The second specifying command overrides the first specifying command.) The specifying command is either a bit line selection command that is valid for all subsequent read commands until the specifying command is overridden or a combined read and bit line selection command whose bit line selection is valid until overridden.

A system corresponding to the first general method of saving power includes a first memory that corresponds to the first general method of saving power, and a host of the first memory that includes a second memory for storing code for instructing the bit line selection mechanism to select the portion of the bit lines and a processor for executing the code.

In some embodiments of the system, the code includes code for issuing a command, to the bit line selection mechanism, that includes a single bit line selection parameter value that specifies either a starting bit line of the portion of bit lines or an ending bit line of the portion of bit lines. In other embodiments of the system, the code includes code for issuing a command, to the bit line selection mechanism, that includes two bit line selection parameter values that specify a range of bit lines. For example, the command may be defined so that the first bit selection parameter is an index of a starting bit line and the second bit selection parameter value is an index of an ending bit line. If the value of the first bit selection parameter is less than the value of the second bit selection parameter then the selected portion of the bit lines is all bit lines from the starting bit line through the ending bit line that intersect the word line at the substantially simultaneously programmed cells. If the value of the first bit selection parameter is greater than the value of the second bit selection parameter then the selected portion of the bit lines is all bit lines from the first bit line through the ending bit line that intersect the word line at the substantially simultaneously programmed cells and all bit lines from the starting bit line through the last bit line that intersect the word line at the substantially simultaneously programmed cells.

In some embodiments of the system, the bit lines are grouped into a plurality of disjoint sets. The bit line selection mechanism includes a register for flagging at least one of the disjoint sets as selected for sensing. Preferably, to instruct the bit line selection mechanism to select the portion of the bit lines, the code includes code for issuing, to the bit line selection mechanism, a bit line selection command that specifies at least one set of the plurality of disjoint sets to be flagged in the register.

In some embodiments of the system, the code includes code for issuing, to the bit line selection mechanism, a command that specifies the portion of the bit lines for a single sensing of the substantially simultaneously programmed cells where the selected bit lines intersect the selected word line. The command is either a bit line selection command that is valid for only one subsequent read command or a combined read and bit line selection command whose bit line selection is valid only for itself. In both cases, if a subsequent read command does not also select bit lines and is not preceded by a command that selects bit lines, then that subsequent read command senses all the simultaneously programmed cells of the word line.

In other embodiments of the system, the code includes code for issuing to the bit line selection mechanism, a command that specifies the portion of the bit lines for every subsequent sensing of the substantially simultaneously programmed cells where the selected bit lines intersect the selected word line, until another command that specifies the portion of the bit lines is issued. (The second specifying command overrides the first specifying command.) The specifying command is either a bit line selection command that is valid for all subsequent read commands until the specifying command is overridden or a combined read and bit line selection command whose bit line selection is valid until overridden.

A computer-readable storage medium corresponding to the first general method of saving power has embodied thereon computer-readable code that includes program code for instructing the bit line selection mechanism of the memory that corresponds to the first general method of saving power to select the portion of the bit lines.

The second general method for saving power is for reading a physical page of cells of a memory. Hard bits from all the cells of the physical page are sensed. Only a portion of the cells of the physical page are selected for sensing soft bits. Soft bits are sensed from only the selected portion of the cells of the physical page.

Preferably, errors in the hard bits are corrected according to the soft bits. Most preferably, the correcting of the errors includes, for each of one or more cells from which one or more soft bits have been sensed, computing a reliability measure of at least one hard bit sensed from that cell in accordance with the soft bit(s).

Preferably, the portion of the cells of the physical page is selected in accordance with the hard bits.

Preferably, the selected portion of the cells of the physical page includes only cells of the physical page that have stored therein a single selected sub-word of a code word that is stored in the physical page.

Preferably, the selecting excludes, from the selected portion of the cells of the physical page, cells of the physical page in which is stored one or more code words.

Preferably, based on the soft bits, a value of at least one statistical parameter of the entire physical page is estimated.

A controller corresponding to the second general method of saving power controls a memory that includes a physical page of cells, a sensing mechanism for sensing the cells and a selection mechanism for selecting cells of the physical page for sensing. The controller uses the sensing mechanism to sense hard bits from all the cells of the physical page. The controller uses the selection mechanism to select only a portion of the cells of the physical page for sensing soft bits. The controller uses the sensing mechanism to sense soft bits from only the selected portion of the cells of the physical page. A memory device corresponding to the second general method of saving power includes both the memory and the controller.

A system corresponding to the second general method of saving power includes a first memory and a host of the first memory. The first memory includes a physical page of cells, a sensing mechanism for sensing the cells and a selection mechanism for selecting cells of the physical page for sensing. The host includes a second memory and a processor. The second memory is for storing code. The code is for using the sensing mechanism to sense hard bits from all the cells of the physical page, for using the selection mechanism to select only a portion of the cells of the physical page for sensing soft bits, and for using the sensing mechanism to sense soft bits from only the selected portion of the cells of the physical page. The processor is for executing the code.

A computer-readable storage medium corresponding to the second general method of saving power has embodied thereon computer-readable code for managing a memory that includes a physical page of cells, a sensing mechanism for sensing the cells and a selection mechanism for selecting cells of the physical page for sensing. The computer-readable code includes program code for using the sensing mechanism to sense hard bits from all the cells of the physical page, program code for using the selection mechanism to select only a portion of the cells of the physical page for sensing soft bits, and program code for using the sensing mechanism to sense soft bits from only the selected portion of the cells of the physical page.

The general method for saving time is for reading a plurality of cells of a memory. Both hard bits and soft bits are sensed from all the cells of the plurality. Only a portion of the soft bits are selected to export from the memory.

Preferably, the portion of the soft bits is selected in accordance with the hard bits.

Preferably, errors in the hard bits are corrected according to the soft bits.

Preferably, the selected soft bits are soft bits of a single sub-word of a code word that is stored in the plurality of cells.

Preferably, the selecting excludes soft bits of one or more code words that are stored in the plurality of cells.

A controller corresponding to the general method of saving time controls a memory that includes a plurality of cells, a sensing mechanism for sensing hard and soft bits from the cells of the plurality, an export mechanism for exporting the sensed bits and a selection mechanism for selecting which bits to export. The controller uses the sensing mechanism to sense the hard bits and the soft bits. The controller uses the export mechanism to receive all the hard bits from the memory. The controller uses the selection mechanism to select only a portion of the soft bits to receive from the memory. The controller uses the export mechanism to receive the selected portion of the soft bits. A memory device corresponding to the general method of saving time includes both the memory and the controller.

A system corresponding to the general method of saving time includes a first memory and a host of the first memory. The first memory includes a plurality of cells, a sensing mechanism for sensing hard and soft bits from the cells of the plurality, an export mechanism for exporting the sensed bits and a selection mechanism for selecting which bits to export. The host includes a second memory and a processor. The second memory is for storing code. The code is for using the sensing mechanism to sense the hard bits and the soft bits, for using the export mechanism to receive all the hard bits from the memory, for using the selection mechanism to select only a portion of the soft bits to receive from the memory, and for using the export mechanism to receive the selected portion of the soft bits. The processor is for executing the code.

A computer-readable storage medium corresponding to the general method of saving time has embodied thereon computer-readable code for managing a memory that includes a plurality of cells, a sensing mechanism for sensing hard and soft bits from the cells of the plurality, an export mechanism for exporting the sensed bits and a selection mechanism for selecting which bits to export. The computer-readable code includes program code for using the sensing mechanism to sense the hard bits and the soft bits, program code for using the export mechanism to receive all the hard bits from the memory, program code for using the selection mechanism to select only a portion of the soft bits to receive from the memory, and program code for using the export mechanism to receive the selected portion of the soft bits.

BRIEF DESCRIPTION OF THE DRAWINGS

Various embodiments are herein described, by way of example only, with reference to the accompanying drawings, wherein.

DESCRIPTION OF THE PREFERRED EMBODIMENTS

The principles and operation of fast, low-power reading of a flash memory may be better understood with reference to the drawings and the accompanying description.

Figure 1:
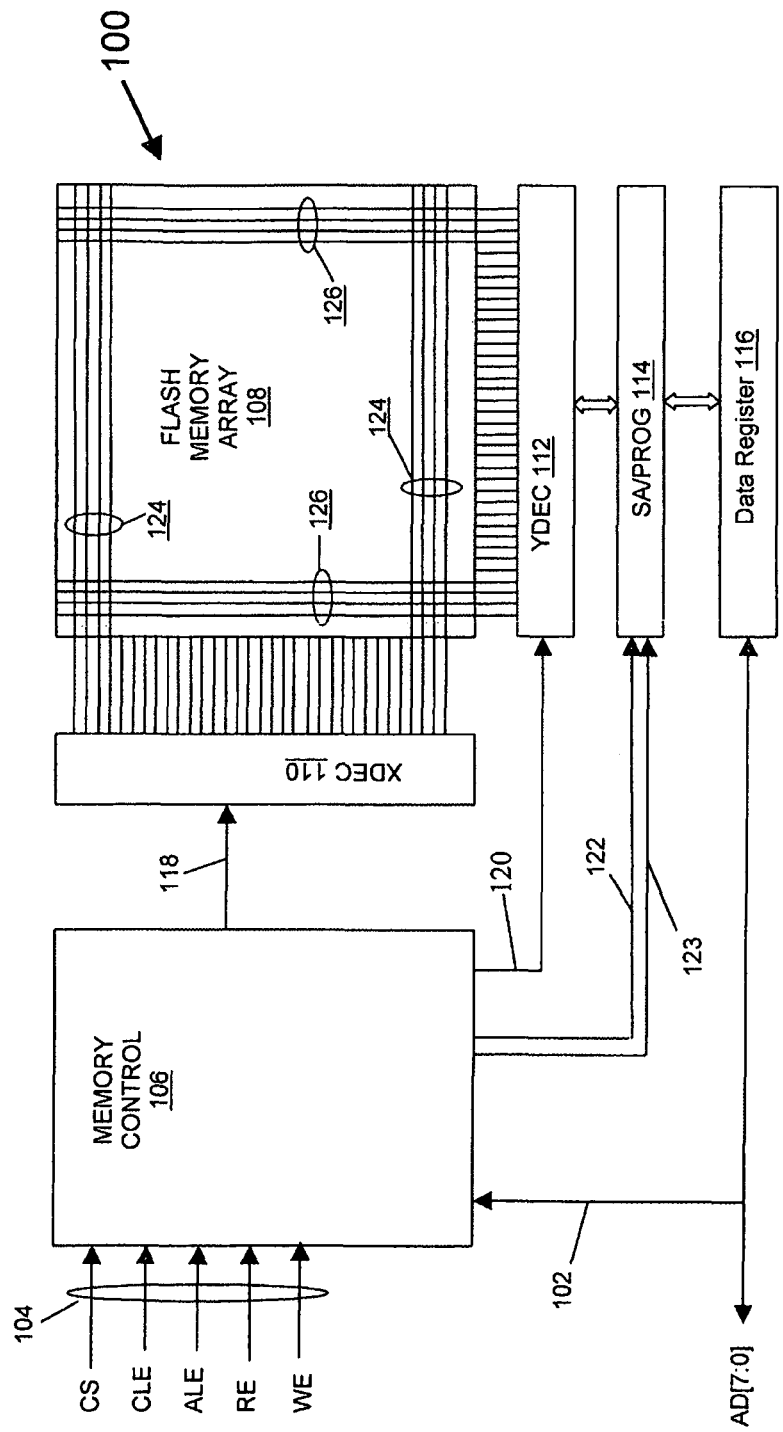
FIG. 1 shows an exemplary internal architecture of a flash memory.

FIG. 1 shows an exemplary internal architecture for a flash memory 100. The primary features include an input/output (I/O) bus 102 and control signals 104 to interface to an external controller, a memory control circuit 106 to control internal memory operations with registers for command, address and status signals. One or more arrays 108 of flash EEPROM cells are included, each array having its own row decoder (XDEC) 110 and column decoder (YDEC) 112, a group of sense amplifiers and program control circuitry (SA/PROG) 114 and a data register 116. Presently, the memory cells usually include one or more conductive floating gates as storage elements but other long-term electron charge storage elements may be used instead. The memory cell array may be operated with two levels of charge defined for each storage element to therefore store one bit of data with each element. Alternatively, more than two storage states may be defined for each storage element, in which case more than one bit of data is stored in each element.

The external interface I/O bus 102 and control signals 104 can include the following:

CS—Chip Select. Used to activate flash memory interface.

CLE—Controls the activating path for commands sent to the command register of memory control circuit 106.

ALE—Controls the activating path for address to the address register of memory control circuit 106.

RE—Serial data-out control. When active, drives the data onto I/O bus 102.

WE—Controls writes to the I/O port.

AD[7:0]—Address/This I/O bus is used to transfer data between Data Bus controller and the flash memory command, address and data registers of memory control 106.

In addition to these signals, it is also typical that the memory have a means by which the storage subsystem controller may determine that the memory is busy performing some task. Such means could include a dedicated signal or a status bit in an internal memory register that is accessible while the memory is busy.

This interface is given only as an example as other signal configurations can be used to give the same functionality. FIG. 1 shows only one flash memory array 108 with its related components, but a multiplicity of such arrays can exist on a single flash memory chip that share a common interface and memory control circuitry but have separate XDEC 110, YDEC 112, SA/PROG 14 and data register 116 circuitry in order to allow parallel read and program operations.

Data are transferred from the memory array through the data register 116 to an external controller via the data registers' coupling to the I/O bus AD[7:0] 102. This data transfer is referred to in the appended claims as "exporting" the data from flash memory 100. Data register 116 is also coupled to sense amplifier/programming circuit 114. The number of elements of data register 116 coupled to each sense amplifier/programming circuit element may depend on the number of bits stored in each storage element of the memory cells, flash EEPROM cells each containing one or more floating gates as the storage elements. Each storage element may store a plurality of bits, such as two or four, if the memory cells are operated in a multi-state mode. Alternatively, the memory cells may be operated in a binary mode to store one bit of data per storage element.

Row decoder 110 decodes row addresses for array 108 in order to select the physical page to be accessed. Row decoder 110 receives row addresses via internal row address lines 118 from memory control logic 106. Column decoder 112 receives column addresses via internal column address lines 120 from memory control logic 106. Rows 124 of array 108 also are referred to herein as "word lines". Columns 126 of array 108 also are referred to herein as "bit lines". For simplicity of illustration, only the first four rows 124, the last four rows 124, the first four columns 126 and the last four columns 126 of array 108 are shown explicitly in array 108.

The cells of array 108 are at the intersections of word lines 124 and bit lines 126. In each bit line 126, the cells are connected in series, as in NAND flash memories, rather than in parallel as in NOR flash memories. Bit lines 126 are ordered, e.g. from left to right, so that the leftmost bit line 126 is assigned the ordinal number "1", the next-to-leftmost bit line 126 is assigned the ordinal number "2", etc.

The operation of memory control circuit 106 in reading data from flash memory array 108 and writing data to flash memory array 108 now will be described.

Figure 2:
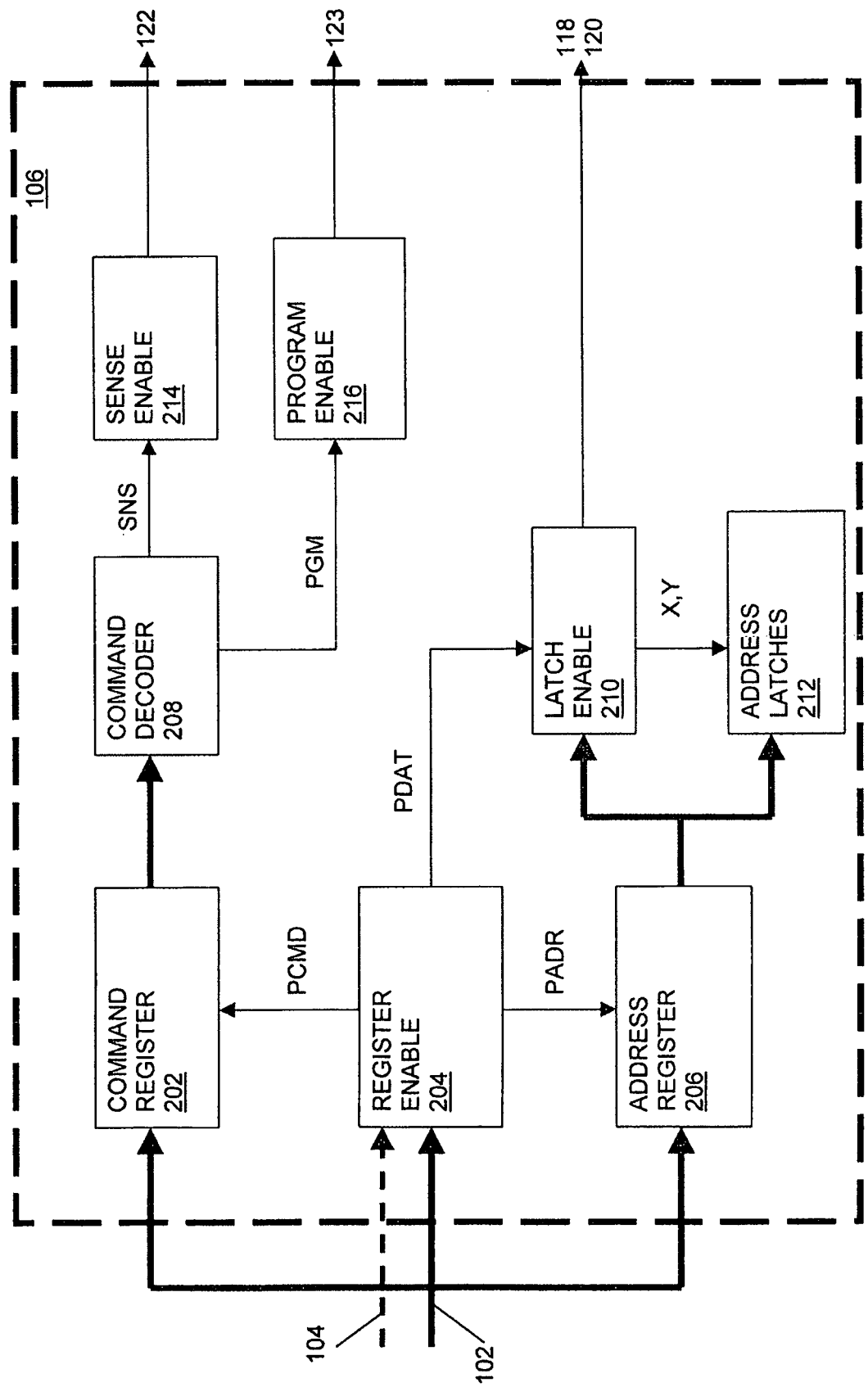
FIG. 2 is a simplified block diagram of the memory control circuit of the flash memory of FIG. 1.

FIG. 2 is a simplified block diagram of memory control circuit 106. A register enable circuit 204 has inputs coupled to an address register 206, to a command register 202 and to a latch enable circuit 210. Upon receiving from the external controller an ALE control signal 104 that indicates that an address descriptor is to follow, register enable circuit 204 activates an enable line PADR, which causes a subsequent chunk address descriptor from the external controller on I/O bus 102 to be latched in to address register 206. A latch enable circuit 210 coupled to address register 206 thereupon activates latch enable lines X and Y to latch the chunk address stored in address register 206 into appropriate row and column latches of address latches 212. The chunk addresses stored in address latches 212 are then provided over appropriate lines of internal row address lines 118 to row decoder 110 and internal column address lines 120 to column decoder 112.

Upon receiving from the external controller a control signal 104 that indicates that data are to follow (because the external controller wants to write the data to flash memory array 108), register enable circuit 204 activates an enable line PDAT that causes a chunk of data on I/O bus 102 to be latched into data register 116.

Upon receiving from the external controller a CLE control signal 104 that indicates that a command is to follow, register enable circuit 204 activates an enable line PCMD, which causes a subsequent read or write command from the external controller on I/O bus 102 to be latched into command register 202. A command decoder 208 thereupon reads the command stored in command register 202.

If the command is a write command, command decoder 208 decodes the command to activate a program line PGM. A program enable circuit 216 receives the program line PGM and the most significant bit from the chunk address stored in address register 206 and activates, in response thereto, program enable lines 123 provided to sense amplifier/programming circuits 114 to selectively activate their program/verify modes of operation to program the data in data register 116 into flash memory array 108.

If the command is a read command, command decoder 208 decodes the command to activate a sense enable circuit 214 that in turn activates sense enable line 122 provided to sense amplifier/programming circuits 114 to selectively activate their sense modes of operation to sense the threshold voltages stored in the cells at the intersections of the latched row 124 and the latched columns 126 of flash memory array 108. The results of the sensing are loaded into data register 116 that then is read by the external controller.

Each read command from the external controller causes data to be read from a single row 124 of flash memory array 108 as specified by the chunk address descriptor. Hence, each row value of address latches 212 is for a respective row 124 of flash memory array 108. The column latches of address latches 212 are for groups of columns 126 of flash memory array 108, with columns 126 grouped per column latch in a manner that saves the power conventionally spent on sensing soft bits.

Conventionally, each group of column latches corresponds to an entire physical page on each row 124 of flash memory array 108. Depending on how memory 100 is configured, each row 124 of cells could itself be a single physical page, or alternatively each row 124 of cells could include two, three or more physical pages. A command from the external controller to write data to a physical page causes sense amplifier/programming circuits 114 to program all the cells of the targeted physical page. A command from the external controller to read the hard bits of a physical page causes sense amplifier/programming circuits 114 to sense the hard bits of all the cells of the targeted physical page. A command from the external controller to read soft bits of a physical page causes sense amplifier/programming circuits 114 to read soft bits of all the cells of the targeted physical page.

Figure 3:
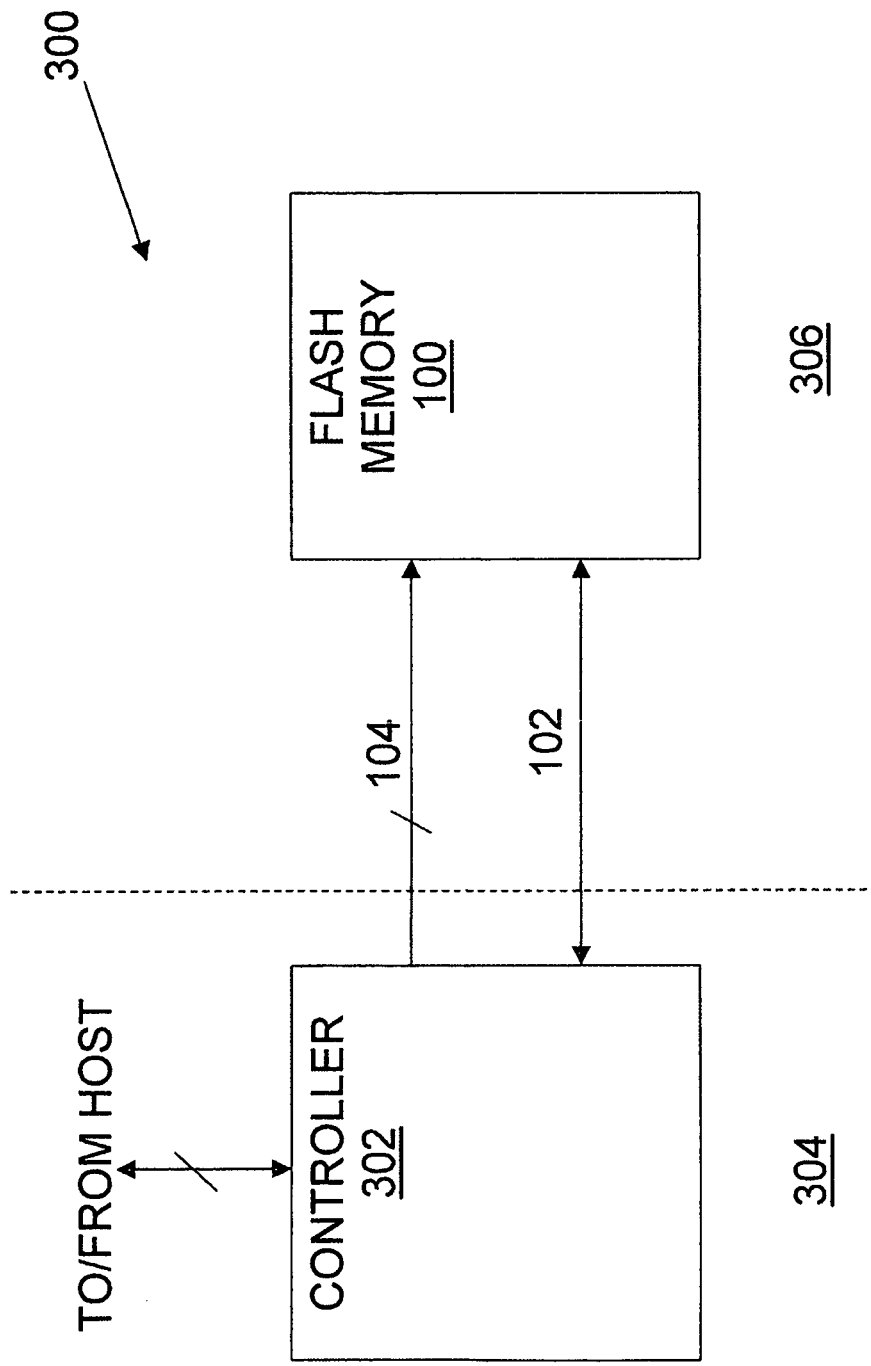
FIG. 3 is a high-level schematic block diagram of a flash memory device that includes the flash memory of FIG. 1 and a controller.

FIG. 3 is a high-level schematic block diagram of a flash memory device 300 in which flash memory 100 is controlled by an external controller 302. Controller 302 is connected or connectable with a host system such as a personal computer, a digital camera, a personal digital assistant. It is the host which initiates commands, such as to store or read data to or from memory array 108, and provides or receives such data, respectively. Controller 302 converts such commands into command signals that can be interpreted and executed by memory control circuit 106. Controller 302 also typically contains buffer memory for the user data being written to or read from memory array 108. A typical memory device 300 includes one integrated circuit chip 304 that includes controller 302, and one or more integrated circuit chips 306 that each contains a memory 100. The trend, of course, is to integrate the memory array and controller circuits of such a memory device together on one or more integrated circuit chips. Memory device 300 may be embedded as part of the host system, or may be included in a memory card that is removably insertable into a mating socket of host systems. Such a card may include the entire memory device, or the controller and memory array, with associated peripheral circuits, may be provided in separate cards.

The power spent on sensing and reading hard and soft bits is composed of two portions—the first part is the power it takes to sense the memory cells into data register 116 (that is—applying reference voltages to the cells and spending power on sensing the results of the comparisons made against them), and the second part is the power it takes to transfer ("export") the read values from data register 116 over bus 102 into external controller 302 (where the error correction decoder and other estimation functions are typically located). The grouping per column latch of columns 126 of flash memory array 108 that is described herein reduces the power of the first portion—the sensing of the memory cells.

As noted above, conventionally, a command from external controller 302 to read soft bits of a physical page causes sense amplifier/programming circuits 114 to read soft bits of all the cells of the targeted physical page. There are cases where we do not actually need the soft bits value for all the memory cells of a physical page, only for some of the memory cells. Nevertheless, conventionally, all the soft bit values of all the cells of a read physical page are sensed into data register 116. But if not all those values are needed, this unnecessarily wastes power.

For example if a flash memory cell consumes 100 [nano Amp] of current when being sensed, and if the number of cells taking part in the decoding computation is 16K (ignoring parity bits and management bits for simplicity), then if only half of the sensed bits are needed by the decoder, then the flash memory wastes 8K×100=800K [nano Amp]=0.8 [milli Amp], each time a sensing operation (a threshold voltage comparison) is done for a single soft bit sensing.

It should be noted that some soft bits require more than one sensing operation for each cell. Typically the first soft bit needs one threshold voltage comparison per cell state, the second soft bit needs two more threshold voltage comparisons per cell state, the third soft bit needs four more voltage comparisons per cell state, etc.

Sensing soft bits of only some of the cells of a physical page may be required for cells in which either of the following occurs:

The hard bits of the cells have already been sensed beforehand, and only the soft bits of some of the cells now are needed.

The data of some cells are not required at all during read, neither the hard bits nor the soft bits.

The only remaining point to discuss in order to show the usefulness of the selective sensing of soft bits that is described herein is to explain when it may be the case that we do not need all the soft bit values but only a portion of them. This is indeed the case in the following four examples:

A. The physical phenomena that cause errors in flash memory cells may be different for different states of the cells. For example, a major source of errors is the drifting of the threshold voltage of memory cells with time because of leakage of electrons from the floating gates of the cells. It is typically the case that cells that are in high states (that is—states corresponding to high threshold voltages) are much more affected by drift phenomena than cells that are in low states (that is—states corresponding to low threshold voltages). This drift phenomenon is sometimes referred to as Data Retention.

Therefore it is reasonable to expect that cells that reside in low states are quite reliable and will not benefit much from an additional soft bit or bits. On the other hand, cells that reside in high states are less reliable and can benefit from the additional information provided by (a) soft bit(s). A decoder designer may therefore implement the following rule—when reading soft bits (because the decoding failed or did not converge in a designated time frame when using only hard bits), sense only soft bit values corresponding to cells that are in the upper half of the group of states (e.g. the eight highest states out of the sixteen states in a four-bit-per-cell flash memory).

B. One type of decoder has the property of decoding of a code word by decoding sub-words of the full word. If one such sub-word fails to decode on its own, only then is information from other sub-words (both sub-words that did not successfully decode and sub-codes, i.e., successfully decoded sub-words) brought to help decode that sub-word.

Soft bits may be used with such decoders after the failure of a sub-word decoding attempt and before the information from other sub-words is employed. Soft bits may be read for the failing sub-word in order to attempt to decode the failing sub-word independently of external information from other sub-words. But if only one sub-word fails and needs soft bits, there is no need to sense and transfer soft bits of all other sub-words, especially the other sub-words that decoded successfully. Therefore a designer of such a decoder may take advantage of the grouping per column latch of columns 126 of flash memory array 108 that is described herein and sense only the soft bit values of the sub-words that actually need them.

C. In some flash storage systems the chunk of data read as a unit from the memory ("page" in the terminology of flash memories) is larger than the chunk of data used for the error correction process. In other words, a chunk of data is stored in a group of cells corresponding to a physical page of the memory (each cell storing one or more data bits), but for the purpose of decoding the data the chunk is divided into separate code words.

A typical example is a physical page of 32K cells, with each cell storing two data bits (for a total of 64K bits), that is divided into four code words each containing 16K bits that are stored in 8K cells. Each such code word is independently decoded. Therefore it may be the case that one of the code words needs soft bits for successful decoding while the other code words do not. In such a case the storage system designer may employ the grouping per column latch of columns 126 of flash memory array 108 that is described herein and sense to data register 116 only the soft bit values corresponding to the cells storing the initially-failed code word.

D. In some flash storage systems the chunk of data read as a unit from the memory ("page" in the terminology of flash memories) is larger than the chunk of data used for statistical estimation, for example of cross-coupling between cells. For sufficiently accurate estimation of cross coupling coefficients only a fraction of the page may be required. For the typical case of case "C." above, out of 32K cells only 10K cells could be needed to estimate the cross coupling coefficients which can be then employed for all 32K cells of a word line.

In this case only the first 10K cells are sensed for both hard bits and two soft bits per cell in word line n and in word line n+1. Based on these bits, the cross coupling coefficients are generated. Subsequently, only the hard bits of word line n+1 and the hard bits and one soft bit per cell of word line n are employed to compensate for cross coupling using the generated cross-coupling coefficients. The outcome is that the soft bits of word line n+1 and the second soft bit of each of the last 22K cells of word line n are not sensed while the power and possibly the time associated with this sensing is saved.

In principle, address latches 212 could include one column latch per bit-line 126. Each column latch would determine whether its corresponding bit-line 126 is operative during the read sense phase and whether current is flowing through that bit-line 126. However, such a design is both expensive in requiring many latches and also complex in the interaction of flash memory 100 with external flash controller 302, as controller 302 has to specify the desired state of each latch.

A much preferable design enables and disables the power consumption of groups of many bit-lines 126 in one signal. For example each group of bit-lines 126 corresponding to one of the sub-words of example B can be controlled by a single respective column latch of address latches 212. Alternatively, each group of bit-lines 126 corresponding to a code word of example C, or a group of example D, can be controlled by a single column latch of address latches 212.

Although example A is not well supported by this preferred implementation, nevertheless some power savings could be obtained for this example as well. Assuming one of the hard bits of the four-bit-per-cell example is indicative if the cell belongs to the eight upper states or to the eight lower states, then in a single sensing operation it is determined if the cell belongs to the upper or lower eight states. This bit can be used to change the $V_{BL}$ (the bit line drain side voltage) to zero and thus inhibit all non-relevant bit lines. This means however that in this case soft bit should be read after the hard bits and not together with the hard bits because before the hard bits are read we cannot distinguish between the upper and lower eight levels. Even though it seems limiting, this is the typical case when soft bits are considered together with error correction.

When external controller 302 has to enable or disable each group of bit-lines 126, the following options are available for address descriptors recognized by memory control circuit 106:

1. A typical read command of a flash memory includes an address pointing to a specific byte (or word, in the less common 16-bit flash memories). The most significant bits of the address define the page being read and the least significant bytes define the byte from which sequential reading is desired. If a read command points, for example, to byte 3072 out of 4096 bytes in a page, it can be taken as an indication that controller 302 intends to read only the highest quarter of the page. Flash memory 100 may be configured so that in such case (where the read address points to offset N within the addressed page), to avoid sensing of all bit-lines with offsets less than N.

2. The previous option sets a starting offset for sensing but not an ending offset. If the setting of both a starting offset and an ending offset is desired, flash memory 100 may support a command (to be issued prior to the read command) that explicitly sets two numbers—one for the lower sensed address and one for the upper sensed address. Any bit-line 126 outside the specified range then is not sensed.

3. If finer resolution control, by external controller 302, of which cells are sensed is desired, than flash memory 100 may be configured to contain a "sensing control register" of several bits, each bit controlling one section of the page. For example, a 4 KB page may be divided into eight 512 bytes sectors, each controlled by one bit from an eight-bit register. Flash memory 100, if so configured, supports a command (issued before the read command) that sets the sensing control register to any desired bit pattern, thus allowing any combination of sectors to be sensed while all other sectors are not sensed.

The setting of the limits in method 2 and the setting of the register in method 3 may be for one read only and repeated for each page read, or may remain in effect until changed or reset to a default value.

Like the power spent by flash memory. 100 and external controller 302 to sense and read hard and soft bits, the time that external controller 302 spends in reading soft bits from flash memory 100 is composed of two portions—the first part is the time it takes to sense the memory cells into data register 116 (that is—the time to apply reference voltages to the cells and sense the results of the comparisons made against them), and the second part is the time it takes to transfer ("export") the read values from data register 116 over bus 102 to external controller 302.

There are cases where we do not actually need the soft bits value for all the memory cells of a physical page, only for some of them. Conventional systems nevertheless always transfer all the soft bit values of all cells to external controller 302. But if not all those values are really needed, this unnecessarily wastes time. A typical flash bus cycle may be between 30 and 50 nanoseconds, in which time 8 bits are transferred (or 16 bits in the less common case of 16 bit flash devices). If the number of cells taking part in the decoding computation is 16K (ignoring parity bits and management bits for simplicity), but only half of the bits are needed by the decoder, then an 8-bit flash device having a bus cycle of 50 nanoseconds wastes 8×1024×50/8=51,200 nanoseconds=51.2 microseconds, each time a soft bit is read.

Transferring out only part of the data residing in a data register of a NAND flash memory (e.g., data register 116 of flash memory 100) does not require any additional circuitry or commands in the flash memory—every flash memory that supports the reading of soft bits has the capability (using standard available commands) to start data transfer from any arbitrary address in the data register, transfer out any desired number of bytes sequentially from the starting address, and then re-position the transfer pointer to any desired second address in the data register, transfer sequentially any number bytes, and so on.

The only remaining point to discuss in order to show the feasibility and usefulness of partial data transfer out of a data register such as data register 116 is to explain when it may be the case that we do not need all the soft bit values but only a portion of them. This is indeed the case in the following examples—

A. The physical effects causing errors in flash memory cells affect different states of the cells differently. For example, a major source of errors is the drifting of the threshold voltage of memory cells with time because of leakage of electrons from the floating gates of the cells. It is typically the case that cells that are in high states (that is—states corresponding to high threshold voltages) are much more affected by drift phenomena than cells that are in low states (that is—states corresponding to low threshold voltages). Therefore it is reasonable to expect that cells that are read (using only hard bits) in low states are quite reliable and will not benefit much from an additional soft bit or bits. On the other hand, cells that are read (using only hard bits) in high states are less reliable and can benefit from the additional information provided by (a) soft bit(s). A decoder designer may therefore implement the following rule—when reading soft bits (because the decoding failed when using only hard bits), read only soft bit values corresponding to cells that are in the upper half of the group of states (e.g. the eight highest states out of the sixteen states in a four-bit-per-cell flash memory).

B. As noted above, one type of decoder has the property of starting decoding of a code word at sub-words of the full code word. If one such sub-word fails to decode on its own, only then is information from other sub-words (both sub-words that did not successfully decode and sub-codes, i.e., successfully decoded sub-words) brought to help decode that sub-word. Soft bits may be used with such decoders after the failure of a sub-word decoding and before the information from other sub-words is used. Soft bits may be read for the failing sub-word in order to attempt to decode the failing sub-word locally without external information from other sub-words. But if only one sub-word failed and needs soft bits, there is no need to transfer soft bits of the other (non-failing) sub-words. Therefore a designer of such a decoder may transfer only the soft bit values of the sub-words that actually need them.

C. In some flash storage systems the chunk of data read as a unit from the memory ("page" in the terminology of flash memories) is larger than the chunk of data used for the error correction process. In other words, a chunk of data is stored in a group of cells corresponding to a physical page of the memory (each cell storing one or more data bits), but for the purpose of decoding the data the chunk is divided into separate code words. A typical example is a physical page of 32K cells, with each cell storing two data bits (for a total of 64K bits), that is divided into four code words each containing 16K bits that are stored in 8K cells. Each such code word is independently decoded. Therefore it may be the case that one of the code words needs soft bits for successful decoding while the other code words do not. In such a case the storage system designer may transfer to external controller 302 only the soft bit values corresponding to the cells storing the initially-failed code word, even if the soft bits of the whole physical page are read from the memory cells to the data register at the same time and are ready to be transferred to the controller.

Figure 4:
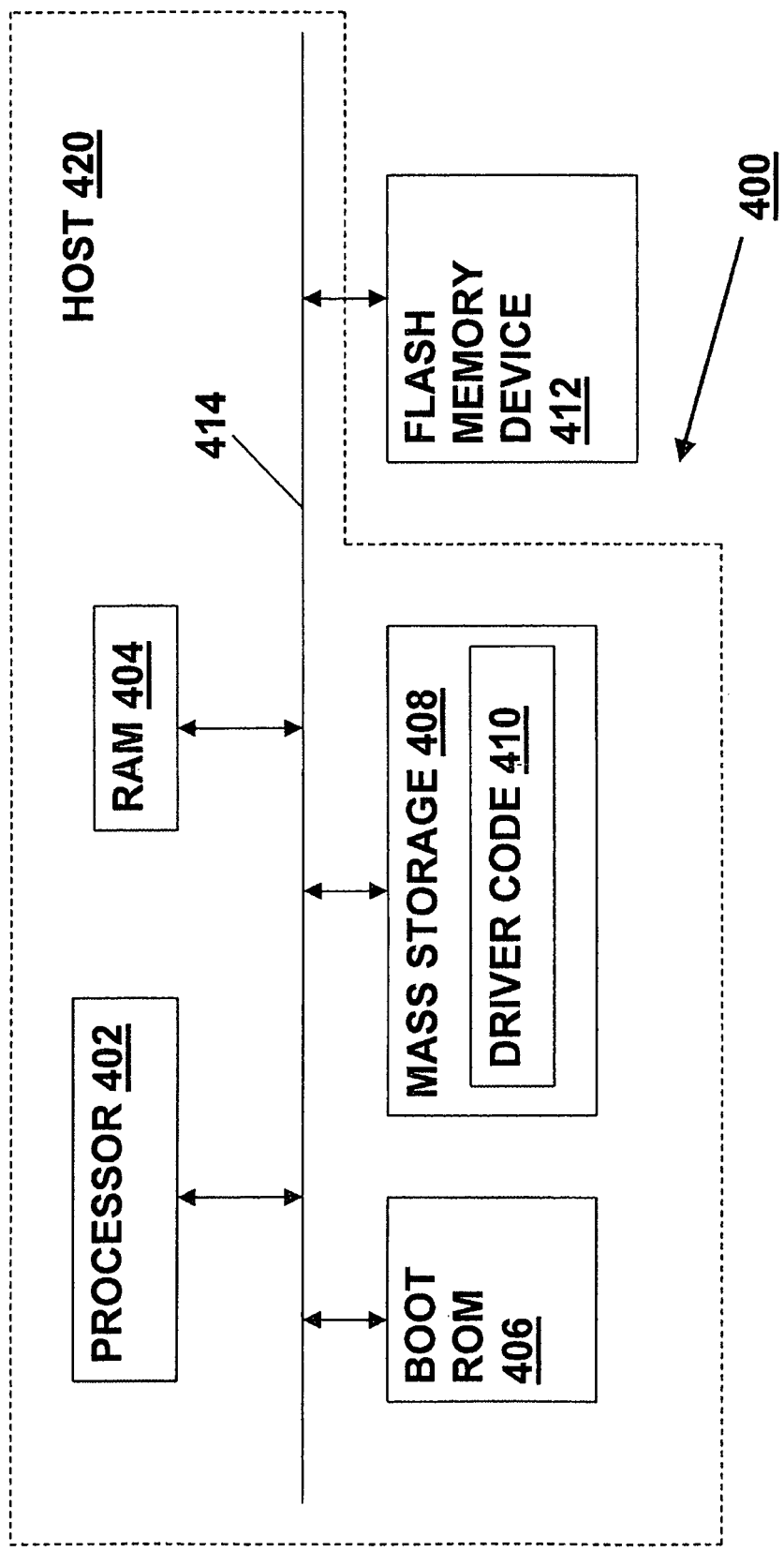
FIG. 4 is a high-level block diagram of a memory system in which most of the functionality of controller of FIG. 3 is emulated by software.

FIG. 4 is a high-level block diagram of a system 400 in which most of the functionality of controller 302 is effected by software. System 400 includes a processor 402 and four memory devices: a RAM 404, a boot ROM 406, a mass storage device (hard disk) 408 and a modified flash memory device of FIG. 3 as a flash memory device 412, all communicating via a common bus 414. The difference between flash memory device 300 of FIG. 3 and flash memory device 412 is that the controller of flash memory device 412 functions only as an interface to bus 414; the rest of the functionality of controller 302 of FIG. 3 as described above is emulated by flash memory driver code 410 that is stored in mass storage device 408 and that is executed by processor 402 to interface between user applications executed by processor 402 and flash memory device 412, and to manage the flash memory of flash memory device 412. In addition to the conventional functionality of such flash management driver code, driver code 410 emulates the functionality of controller 302 of FIG. 3 with respect to saving power and time in reading the flash cells of flash memory device 412, as described above. Driver code 410 typically is included in operating system code for system 400 but also could be freestanding code.

The components of system 400 other than flash memory device 412 constitute a host 420 of flash memory device 412. Mass storage device 408 is an example of a computer-readable storage medium bearing computer-readable driver code for using, as reference cells of a flash memory array, cells of the flash memory array that otherwise would not be used for any purpose. Other examples of such computer-readable storage media include read-only memories such as CDs bearing such code.

A limited number of embodiments of methods for saving time and power in reading the cells of a flash memory, and of a memory, device and system that use the methods, have been described. It will be appreciated that many variations, modifications and other applications of the methods, device and system may be made.

What is claimed is:

1. A memory device comprising:
  (a) a memory including:
    (i) a plurality of cells at intersections of a plurality of word lines and a plurality of bit lines, with the cells that share a common bit line being connected in series,
    (ii) a word line selection mechanism for selecting one of the word lines,
    (iii) a programming mechanism for programming, substantially simultaneously, at least a portion of the cells of the selected word line, and
    (iv) a bit line selection mechanism for selecting only a portion of the bit lines that intersect the selected word line at the at least portion of the cells that was programmed substantially simultaneously, and for sensing only the cells, of the at least portion of the cells of the selected word line, that are at intersections of the selected word line with the selected portion of the bit lines; and
  (b) a controller, of the memory, for instructing the bit line selection mechanism to select the portion of the bit lines;
  wherein, to instruct the bit line selection mechanism to select the portion of the bit lines, the controller issues a command that specifies the portion of the bit lines for every command issued subsequently by the controller for sensing the cells, of the at least portion of the cells of the selected word line, that are at intersections of the selected word line with the selected portion of the bit lines, until the controller issues another command that specifies the portion of the bit lines.

2. The memory device of claim 1, wherein, to instruct the bit line selection mechanism to select the portion of the bit lines, the controller issues a command that includes a single bit line selection parameter value.

3. The memory device of claim 2, wherein the single bit line selection parameter value specifies a starting bit line of the portion of bit lines.

4. The memory device of claim 2, wherein the single bit line selection parameter value specifies an ending bit line of the portion of bit lines.

5. The memory device of claim 1, wherein, to instruct the bit line selection mechanism to select the portion of the bit lines, the controller issues a command that includes two bit line selection parameter values.

6. A memory device comprising:
(a) a memory including:
   (i) a plurality of cells at intersections of a plurality of word lines and a plurality of bit lines, with the cells that share a common bit line being connected in series,
   (ii) a word line selection mechanism for selecting one of the word lines,
   (iii) a programming mechanism for programming, substantially simultaneously, at least a portion of the cells of the selected word line, and
   (iv) a bit line selection mechanism for selecting only a portion of the bit lines that intersect the selected word line at the at least portion of the cells that was programmed substantially simultaneously, and for sensing only the cells, of the at least portion of the cells of the selected word line, that are at intersections of the selected word line with the selected portion of the bit lines; and
(b) a controller, of the memory, for instructing the bit line selection mechanism to select the portion of the bit lines;
wherein the bit lines are grouped into a plurality of disjoint sets and wherein the bit line selection mechanism includes a register for flagging at least one of the disjoint sets as selected for sensing;
wherein, to instruct the bit line selection mechanism to select the portion of the bit lines, the controller issues a bit line selection command that specifies at least one set of the plurality of disjoint sets to be flagged in the register.

7. A memory device comprising:
(a) a memory including:
   (i) a plurality of cells at intersections of a plurality of word lines and a plurality of bit lines, with the cells that share a common bit line being connected in series,
   (ii) a word line selection mechanism for selecting one of the word lines,
   (iii) a programming mechanism for programming, substantially simultaneously, at least a portion of the cells of the selected word line, and
   (iv) a bit line selection mechanism for selecting only a portion of the bit lines that intersect the selected word line at the at least portion of the cells that was programmed substantially simultaneously, and for sensing only the cells, of the at least portion of the cells of the selected word line, that are at intersections of the selected word line with the selected portion of the bit lines; and
(b) a controller, of the memory, for instructing the bit line selection mechanism to select the portion of the bit lines;
wherein, to instruct the bit line selection mechanism to select the portion of the bit lines, the controller issues a command that specifies the portion of the bit lines for a single command issued by the controller for sensing the cells, of the at least portion of the cells of the selected word line, that are at intersections of the selected word line with the selected portion of the bit lines.

8. A system comprising:
(a) a first memory including:
   (i) a plurality of cells at intersections of a plurality of word lines and a plurality of bit lines, with the cells that share a common bit line being connected in series,
   (ii) a word line selection mechanism for selecting one of the word lines,
   (iii) a programming mechanism for programming, substantially simultaneously, at least a portion of the cells of the selected word line, and
   (iv) a bit line selection mechanism for selecting only a portion of the bit lines that intersect the selected word line at the at least portion of the cells that was programmed substantially simultaneously, and for sensing only the cells, of the at least portion of the cells of the selected word line, that are at intersections of the selected word line with the selected portion of the bit lines;
(b) a host of the first memory, the host including:
   (i) a second memory for storing code for instructing the bit line selection mechanism to select the portion of the bit lines, and
   (ii) a processor for executing the code.

9. The system of claim 8, wherein the code includes code for issuing a command, to the bit line selection mechanism, that includes a single bit line selection parameter value.

10. The system of claim 9, wherein the single bit line selection parameter value specifies a starting bit line of the portion of bit lines.

11. The system of claim 9, wherein the single bit line selection parameter value specifies an ending bit line of the portion of bit lines.

12. The system of claim 8, wherein the code includes code for issuing a command, to the bit line selection mechanism, that includes two bit line selection parameter values.

13. The system of claim 8, wherein the bit lines are grouped into a plurality of disjoint sets and wherein the bit line selection mechanism includes a register for flagging at least one of the disjoint sets as selected for sensing.

14. The system of claim 13, wherein the code includes code for issuing, to the bit line selection mechanism, a bit line selection command that specifies at least one set of the plurality of disjoint sets to be flagged in the register.

15. The system of claim 8, wherein the code includes code for issuing, to the bit line selection mechanism, a command that specifies the portion of the bit lines for a single sensing of the cells, of the at least portion of the cells of the selected word line, that are at the intersections of the selected word line with the selected portion of the bit lines.

16. The system of claim 8, wherein the code includes code for issuing, to the bit line selection mechanism, a command that specifies the portion of the bit lines for every subsequent sensing of the cells, of the at least portion of the cells of the selected word line, that are at the intersections of the selected word line with the selected portion of the bit lines, until another command that specifies the portion of the bit lines is issued.

17. A controller, for a memory that includes:
(a) a plurality of cells,
(b) a sensing mechanism for sensing hard and soft bits from the cells of the plurality,
(c) an export mechanism for exporting the sensed bits, and
(d) a selection mechanism for selecting which bits to export, the controller being operative:
   (i) to use the sensing mechanism to sense the hard and soft bits;
   (ii) to use the export mechanism to receive all the hard bits from the memory;
   (iii) to use the selection mechanism to select only a portion of the soft bits to receive from the memory; and
   (iv) to use the export mechanism to receive the selected portion of the soft bits.

18. A memory device comprising:

(a) a memory including:
- (i) a plurality of cells,
- (ii) a sensing mechanism for sensing hard and soft bits from the cells of the plurality,
- (iii) an export mechanism for exporting the sensed bits, and
- (iv) a selection mechanism for selecting which bits to export; and (b) a controller for:
- (i) using the sensing mechanism to sense the hard and soft bits,
- (ii) using the export mechanism to receive all the hard bits from the memory,
- (iii) using the selection mechanism to select only a portion of the soft bits to receive from the memory, and
- (iv) using the export mechanism to receive the selected portion of the soft bits.

19. A system comprising:

(a) a first memory including:
- (i) a plurality of cells,
- (ii) a sensing mechanism for sensing hard and soft bits from the cells of the plurality,
- (iii) an export mechanism for exporting the sensed bits, and
- (iv) a selection mechanism for selecting which bits to export; and (b) a host of the first memory, the host including:
- (i) a second memory for storing code for:
  - (A) using the sensing mechanism to sense the hard and soft bits,
  - (B) using the export mechanism to receive all the hard bits from the memory,
  - (C) using the selection mechanism to select only a portion of the soft bits to receive from the memory, and
  - (D) using the export mechanism to receive the selected portion of the soft bits, and
- (ii) a processor for executing the code.

\* \* \* \* \*